United States Patent [19]
Lukaszek

[11] Patent Number: 5,998,282
[45] Date of Patent: Dec. 7, 1999

[54] METHOD OF REDUCING CHARGING DAMAGE TO INTEGRATED CIRCUITS IN ION IMPLANT AND PLASMA-BASED INTEGRATED CIRCUIT PROCESS EQUIPMENT

[76] Inventor: Wieslaw A. Lukaszek, 127 Marine Rd., Woodside, Calif. 94062

[21] Appl. No.: 08/955,162

[22] Filed: Oct. 21, 1997

[51] Int. Cl.⁶ .................... H01L 21/301; H01L 21/46; H01L 21/78; H01L 21/326; H01L 21/479
[52] U.S. Cl. ................ 438/460; 438/462; 438/466
[58] Field of Search .................... 438/460, 466, 438/462

[56] References Cited

U.S. PATENT DOCUMENTS 5,462,636  10/1995  Chen et al. .
5,521,125   5/1996  Ormond et al. .
5,696,404  12/1997  Murari et al. .

FOREIGN PATENT DOCUMENTS 55-007019   2/1980  Japan .

*Primary Examiner*—John F. Niebling
*Assistant Examiner*—Josetta I. Jones
*Attorney, Agent, or Firm*—Townsend and Townsend and Crew LLP; Henry K. Woodward

[57] ABSTRACT

Charging damage to integrated circuits during ion implantation and plasma processing of integrated circuit die in a semiconductor wafer is reduced by processing scribe lanes during wafer fabrication to facilitate the flow of current to and from the wafer substrate through the scribe lanes during integrated circuit fabrication and reduce current flow through integrated circuit components.

14 Claims, 2 Drawing Sheets

METHOD OF REDUCING CHARGING DAMAGE TO INTEGRATED CIRCUITS IN ION IMPLANT AND PLASMA-BASED INTEGRATED CIRCUIT PROCESS EQUIPMENT

BACKGROUND OF THE INVENTION

This invention relates generally to the fabrication of integrated circuits in a semiconductor wafer, and more particularly the invention relates to reducing charging damage to ICs during ion implant and plasma processing of the semiconductor wafer in IC fabrication.

The charging of wafer surface in IC process equipment utilizing charged particles for their operation, such as ion implanters and plasma-based process equipment, is well documented. The build-up of this surface charge on MOS transistor gates and capacitors leads to increasing voltage across the gate oxides until the oxides begin to conduct, shunting the deposited charge to wafer substrate. Since the wafer substrate is typically floated electrically, the current entering the substrate in one part of the wafer exits the substrate in some other part of the wafer, as illustrated in FIG. 1 for wafer 10, transistor 12, and currents 14. Consequently, both positive currents (entering the wafer) and negative currents (leaving the substrate) have been recorded with the CHARM-2 monitor wafers. See Lukaszek U.S. Pat. No. 5,594,328. Since the passage of current through gate oxides is accompanied by charge trapping in the oxide, leading to oxide damage and MOS transistor performance degradation or failure, it is highly desirable to minimize the current flow through gate oxides during IC fabrication in order to maximize IC yield and reliability.

The characterization of the charging current densities with the CHARM-2 monitor wafers in ion implanters and other plasma-based equipment indicates that typical positive and negative J-V plots are of the form shown in FIGS. 2(a) and 2(b). It should be observed that both positive and negative J-V plots obtained at any location on the wafer show monotonically decreasing current density with increasing surface-substrate potential (in accordance with plasma theory). Consequently, the sums of all positive and negative currents over the wafer are also monotonically decreasing function of surface-substrate potential, similar to FIGS. 2(a) and 2(b), representing the operational characteristics of the plasma within the physical and electrical constraints imposed on it by the given plasma equipment configuration in its particular operating state.

It has also been observed through the use of the CHARM-2 monitor wafers that when the wafer surface is covered with photoresist in a manner which limits the gate oxide area available for conduction of the charging currents, the magnitudes of the surface-substrate potentials and the corresponding oxide current densities increase. This phenomenon may be understood with the help of FIGS. 2(a) and 2(b): decreasing the gate oxide area available for conduction of charging currents results in a different plasma operating state, characterized by reduced over-all current flow through the substrate, but accompanied by increased surface-substrate potentials, in accordance with FIGS. 2(a) and 2(b).

The present invention is directed toward minimizing the surface-substrate potentials to minimize the currents which flow through the gate oxides, thus minimizing MOS transistor damage during IC fabrication.

SUMMARY OF THE INVENTION

In accordance with the invention the potential across gate oxides, and the accompanying oxide currents (which are exponentially dependent on the voltage across the oxides) are minimized by implementing, individually and in concert, a collection of processes and features to increase the availability of alternate current shunt paths to facilitate the flow of the charging currents through the substrate, but not through MOS transistors.

Although to increase shunt path current flow within the IC die may be difficult due to circuit layout constraints, proper preparation of the scribe lanes (the regions between die, which are ultimately sacrificed during wafer cutting into individual ICs) facilitates current shunting through the scribe lanes, thus reducing the potential between the surface of the wafer and the substrate, and reducing the available current flow through the electrical component within the die, most notably the MOS transistor gate oxides. This approach is illustrated in FIG. 3 for substrate 20, transistor 22, and currents 24 through scribe lanes 26.

DETAILED DESCRIPTION OF ILLUSTRATIVE EMBODIMENTS

Figure 1:
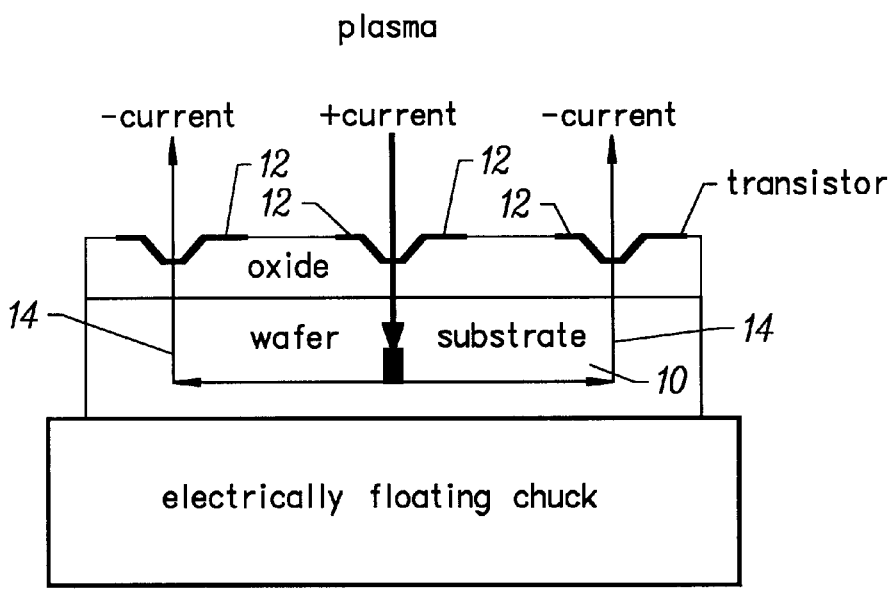
FIG. 1 is a section view illustrating current flow in a conventional semiconductor wafer during ion implant and plasma processing.
Figure 2A:
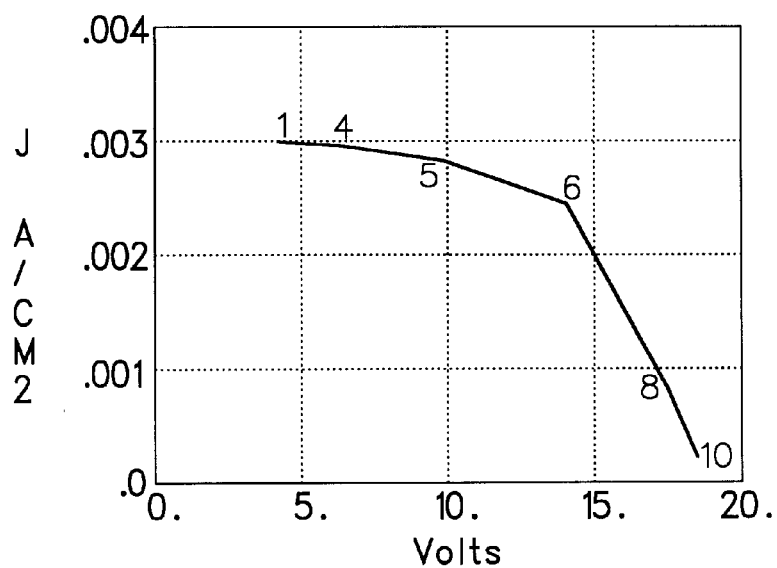
FIGS. 2a, 2b are graphs illustrating current density versus wafer charge for the device of FIG. 1.
Figure 2B:
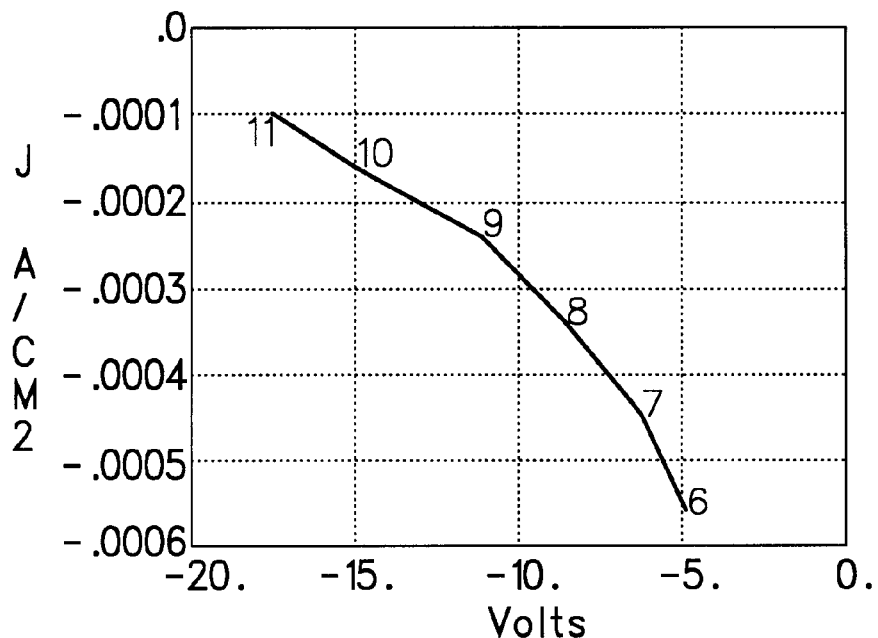
Figure 3:
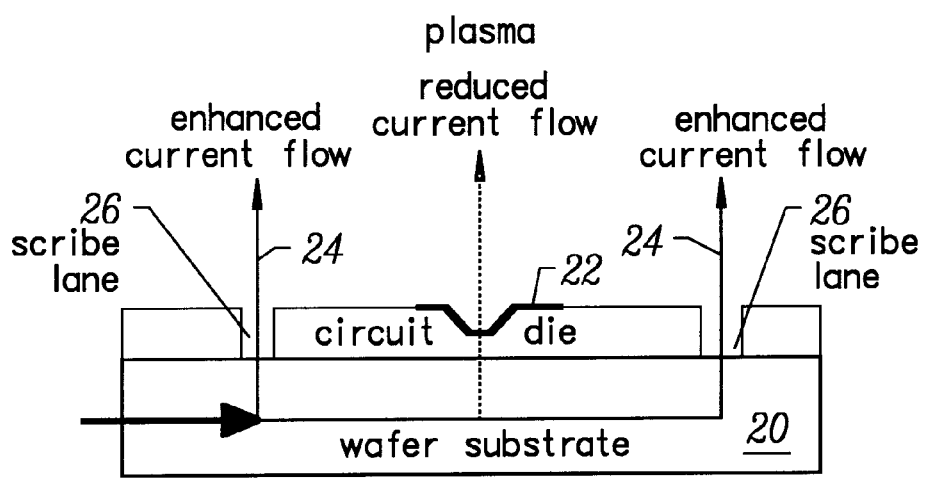
FIG. 3 is a section view illustrating current flow in a semiconductor wafer during ion implant and plasma processing in accordance with the invention.

In practicing the invention and reducing charging damage during ion implantation and plasma processing, current paths are created and enhanced in the scribe lanes surrounding each die. Current to and from the substrate is encouraged to flow through paths in the scribe lanes and discouraged from flowing through transistors and device oxides. This leads to the following strategies:

N-wells (or P-wells)

During implantation of N-wells (if the substrate is P-type) or P-wells (if the substrate is N-type), the photoresist covers the scribe lanes so no junctions are formed in the scribe lanes.

Field Oxide

No field oxide (thick oxide used to isolate transistors) is grown (or otherwise implemented) in the scribe lanes.

Gate Oxide

If possible, no gate oxide should be grown (or otherwise implemented) in the scribe lanes to provide current shunt paths during polysilicon (gate) etching and subsequent resist ashing.

Source/Drain Ion Implantation

Since current shunt paths are desired during Source/Drain ion implants, requiring openings in the photoresist which would result in subsequent formation of junctions, only a portion of the scribe lane should be opened to one implant, and the complementary portion should be opened to opposing polarity implant. CHARM-2 results also indicate that a significant reduction in positive potentials (associated with highest current densities, hence most damaging) is attained when light-field resist patterns are employed. Consequently, both n-type and p-type implants should be implemented with light-field resist patterns.

Contact Etching

Scribe lanes should be opened during contact etching (i.e. scribe lanes should not be covered by resist during contact etching) or a maximum number of individual contacts to the scribe lane should be implemented.

Metal Patterning

Since photoresist (an insulator) covers the metal during metal etching, thus blocking the flow of current to the substrate (except at the edge of the metal lines), the metal etch mask should implement in the scribe lane a large number of lines placed on top of the contact holes to maximize current flow through the edges of the metal lines and through the contacts to the substrate. If the metal is patterned through the use of a scheme which does not etch the metal (such as damascene processing), either multiple lines or a single, wide metal line may be implemented.

Via Etching

Scribe lanes should be opened during via etching (I. e. scribe lanes should not be covered by resist during via etching) or a maximum number of individual vias contacting the metal line(s) in the scribe lane should be implemented to provide a current flow path through the via(s), and the underlying metal and contacts, to the substrate.

Subsequent Metal and Via Etching

When multi-layer metalization containing several layers of vias and metal is being implemented, all via and metal layers in the scribe lane should be implemented in the manner described above for via etching and metal patterning.

Other Required Implants and Etching Process Steps

Since it is not possible to enumerate all fabrication steps that may be required for the construction of high-performance (or other) devices of the future, the above should serve to illustrate the principle of this invention, i. e. the scribe lanes should be constructed in such manner as to freely permit the flow of current to the substrate and out of the substrate so as to shunt as much as possible the plasma-induced currents around the die, thus limiting the current available for passage through transistor gate oxides.

Implementation of Additional Current Flow Paths

It may be desirable in the case of large die to introduce current "shunt-paths" within the die, if the spacing between the scribe lanes is too large to be sufficient for adequate current shunting around the die. In that case, these "shunt-paths" may be constructed in accordance with the same guide lines used in the construction of the scribe lanes.

While the invention has been described with reference to specific embodiments, the description is illustrative of the invention and is not to be construed and limiting the invention. Various modifications and applications may occur to those skilled in the art without departing from the true spirit and scope of the invention as defined by the appended claims.

What is claimed is:

1. A method of reducing charging damage to integrated circuits during fabrication of integrated circuit die in a semiconductor wafer, each die being spaced from adjacent die by scribe lanes surrounding the die, the method comprising the step of processing the scribe lanes during wafer processing to facilitate the flow of current to and from the wafer substrate during integrated circuit fabrication and reduce current flow through integrated circuit components and to reduce voltage between a surface of the integrated circuits and the wafer.

2. The method as defined by claim 1 wherein the processing includes masking the scribe lanes during ion implantation of doped wells within each die to prevent P-N junction formation in the scribe lanes.

3. The method as defined by claim 1 wherein the processing includes masking scribe lanes during field oxide growth to prevent oxide formation in the scribe lanes.

4. The method as defined by claim 1 wherein the processing includes masking scribe lanes during gate oxide formation for transistors to prevent oxide formation in the scribe lanes.

5. The method as defined by claim 1 wherein the processing includes opening limited portions of scribe lanes to ion implant during first source/drain ion implantation.

6. The method as defined by claim 5 wherein the processing includes opening additional limited portions of scribe lanes to ion implantation during second source/drain ion implant where such additional limited portions of the scribe lanes are complementary to the first source/drain ion implant.

7. The method as defined by claim 1 wherein the processing includes selectively unmasking photo resist masked scribe lanes during contact etching.

8. The method as defined by claim 7 wherein the processing includes making contacts to scribe lanes during contact formation.

9. The method as defined by claim 8 wherein the processing includes forming metal lines in scribe lanes on contacts during metal patterning for the die.

10. The method as defined claim 1 wherein the processing includes etching portions of scribe lanes to form vias in the scribe lanes during via etching in the die.

11. The method as defined by claim 1 wherein the processing includes forming current shunt paths within each die during wafer processing.

12. The method as defined by claim 1 wherein the processing includes masking scribe lanes during ion implantation doped well within each die to prevent P-N junction formation in the scribe lanes, masking scribe lanes during field oxide growth to prevent oxide formation in the scribe lanes, and masking scribe lanes during gate oxide formation for transistors to prevent oxide formation in the scribe lanes.

13. A method of reducing charging damage to integrated circuits during fabrication of integrated circuit die in a semiconductor wafer, each die being spaced from adjacent die by scribe lanes surrounding the die, the method comprising the step of processing the semiconductor wafer to form current shunt paths within each die to reduce voltage between a surface of the integrated circuits and the wafer and reduce the potential across gate oxides of transistors in the integrated circuits.

14. The method as described in claim 13 and further including processing scribe lanes during wafer processing to facilitate the flow of current to and from the wafer during integrated circuit fabrication to further reduce voltage between a surface of the integrated circuits and the wafer and reduce the potential across gate oxides of transistors in the integrated circuits.

* * * * *